United States Patent [19]

van de Grift et al.

[11] Patent Number: 5,051,746
[45] Date of Patent: * Sep. 24, 1991

[54] INTERPOLATION CIRCUIT FOR USE IN AN A/D CONVERTER

[75] Inventors: Robert E. J. van de Grift; Martien van der Veen, both of Eindhoven, Netherlands

[73] Assignee: U.S. Philips Corporation, New York, N.Y.

[*] Notice: The portion of the term of this patent subsequent to Mar. 27, 2007 has been disclaimed.

[21] Appl. No.: 497,285

[22] Filed: Mar. 22, 1990

Related U.S. Application Data

[63] Continuation of Ser. No. 131,145, Dec. 10, 1987, Pat. No. 4,912,469.

[30] Foreign Application Priority Data

Aug. 3, 1987 [NL] Netherlands .......................... 8701816

[51] Int. Cl.[5] ............................................ H03M 1/36
[52] U.S. Cl. .................................... 341/159; 341/155; 307/354
[58] Field of Search ............... 341/155, 159, 165, 158; 307/360, 361

[56] References Cited

U.S. PATENT DOCUMENTS

| | | | |
|---|---|---|---|
| 4,270,118 | 5/1981 | Brokaw | 341/159 |
| 4,386,339 | 5/1983 | Henry et al. | 341/159 |
| 4,456,904 | 6/1984 | van de Grift | 341/159 |
| 4,737,766 | 4/1988 | van de Plassche | 341/159 |
| 4,912,469 | 3/1990 | van de Grift et al. | 341/159 |

Primary Examiner—A. D. Pellinen
Assistant Examiner—Brian K. Young
Attorney, Agent, or Firm—Bernard Franzblau

[57] ABSTRACT

An interpolation circuit for an A/D converter comprises a first and a second pair of inputs (2, 2'; 3, 3') and at least three pairs of outputs (20, 20'; 24, 24'; 21, 21'). The pairs of inputs receive pairs of two input signals ($V_1$, $V_{1c}$, $V_5$, $V_{5c}$) which are substantially complementary to one another. At least two pairs of outputs (20, 20'; 24, 24') supply pairs of two substantially complementary output signals. A first output (21) of the third pair of outputs (21, 21') is coupled to a first input (2) of the first pair of inputs (2, 2'). The second output (21') of the third pair of outputs is connected to a circuit node other than one of the inputs of the first pair of inputs. This node may be, for example, the first input (3') of the second pair of inputs (FIG. 9). Another possibility is to make the node one end (38) of an impedance element (32) which has its other end coupled to the second input (2') of the first pair of inputs (FIG. 3).

8 Claims, 7 Drawing Sheets

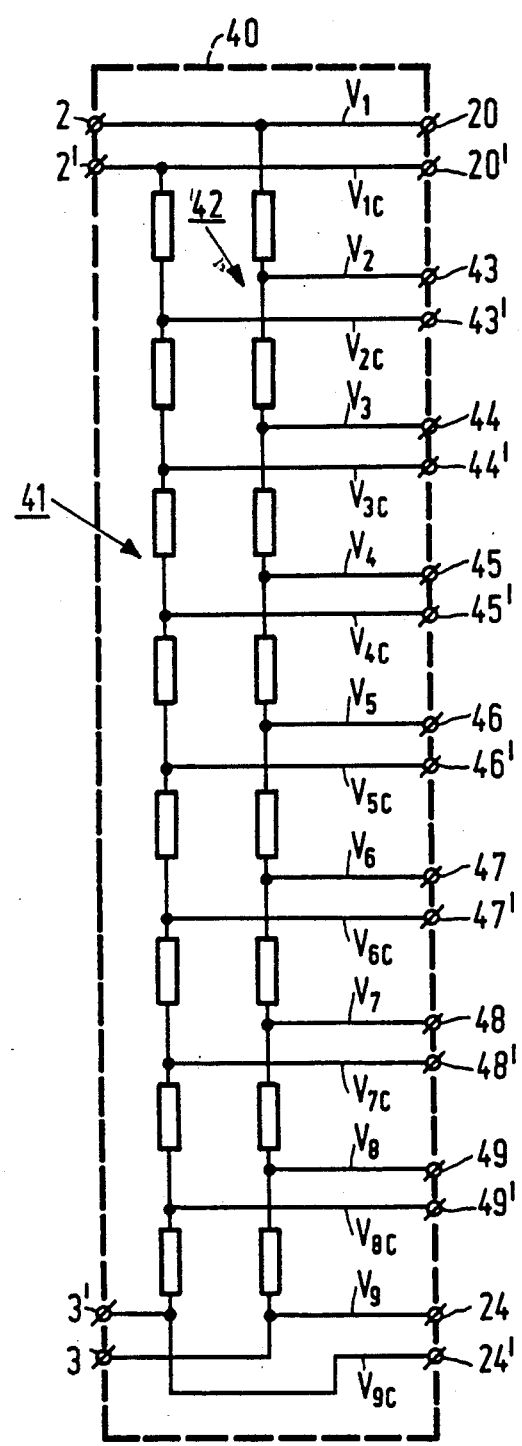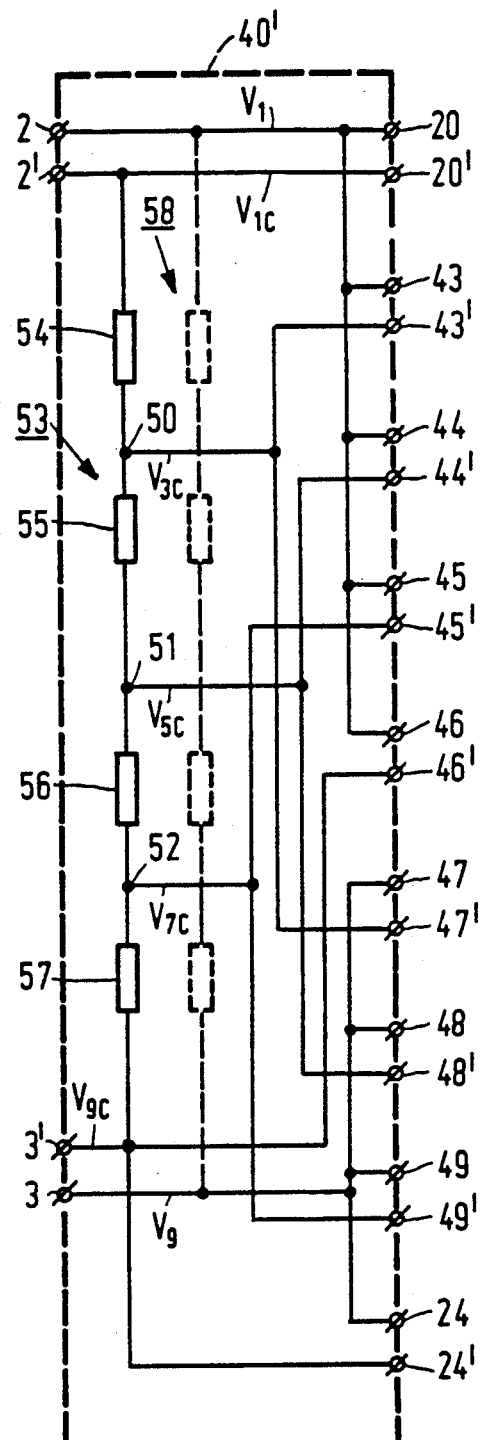
FIG.5
PRIOR ART
FIG.6

INTERPOLATION CIRCUIT FOR USE IN AN A/D CONVERTER

This is a continuation of application Ser. No. 07/131,145 Filed Dec. 10, 1987, now U.S. Pat. No. 4,912,469.

BACKGROUND OF THE INVENTION

This invention relates to an electric circuit for use in an A/D converter, more particularly to an interpolation circuit having a first and a second pair of inputs and at least three pairs of outputs, each pair of inputs serving to receive two input signals which are substantially complementary to one another, each of at least two pairs of outputs supply two substantially complementary output signals. The first pair of outputs is connected to the first pair of inputs and the second pair of outputs is connected to the second pair of inputs. A first output of the third pair of outputs is connected to a node in the circuit which is not one of the inputs of the first pair of inputs. Such a circuit is known from the published European Patent Application no. 227,165 (PHA 1137), a copy of which is on file in this application, and is hereby incorporated by reference. This circuit is used, for example, as an interpolation circuit in analog-to-digital (A/D) converters. Important considerations in developing an A/D converter or the conversion speed, the dissipation, which are directly related to the number of components in the A/D converter, and the resolution.

So-called "flash" converters provide the highest conversion speed. In a fully parallel version of such a converter the input voltage is applied to $2^n-1$ comparators, each of which compare this voltage with one of $2^n-1$ reference values to generate an n-bit digital signal, see for example, J. Peterson, "A monolithic video A/D converter", IEEE JSSC, Dec. 1979, pp. 932-937.

The principal disadvantage of this fully parallel version is the large number of components needed which is due to, inter alia, the large number of comparators required.

Many proposals have been made to reduce the number of comparators in an A/D converter, see for example, U.S. Pat. Nos. 4,270,118 and 4,386,339. Generally these proposals lead to a reduction in conversion speed.

A "folding" system is one of the more promising techniques for reducing the number of components. In a "folding" A/D converter a number of "folding" amplifiers respond to an input voltage and a corresponding number of reference voltages in such a way that each amplifier generates two substantially complementary signals, each of which has a recurring trapezoidal shape as a function of the input voltage level.

European Patent Application no. 227,165 describes an improvement to an A/D converter equipped with folding amplifiers and proposes an interpolation system which interpolates between at least two pairs of said complementary signals which vary with a parameter to generate further pairs of complementary signals representing said parameter.

An input circuit generates at least two pairs of substantially complementary signals. In general these signals are generated in response to an analog input voltage in such a way that the voltages of at least one of the signal pairs vary in a non-insubstantial manner as a function of the input voltage for each value of the input voltage as this voltage varies over a certain input voltage range.

Interpolation is performed with an interpolation circuit comprising two strings each comprising a specific number of series-connected impedance elements, preferably resistors, arranged between two pairs of inputs. To each pair of inputs an associated pair of complementary input signals is applied. Pairs of modes between two consecutive impedance elements in the two strings, which are moreover located at similar positions along the strings, constitute outputs from which pairs of complementary interpolated signals can be taken. Moreover, the two pairs of complementary input signals also constitute two pairs of output signals of the interpolation circuit.

Sampling comparators (sample latches), corresponding in number to the number of pairs of output signals, generate a sequence of digital bits by comparing the voltages of each pair of output signals.

Only the "zero crossings"—that is the signs of the voltage differences—are material. For the rest the magnitude of the signal difference is irrelevant. The result of the steps proposed in said European Application is a reduction of the number of components without a loss of conversion speed or accuracy.

SUMMARY OF THE INVENTION

It is the object of an invention to provide a circuit which enables the number of components to be reduced even further and, in some embodiments, the output impedance of the circuit to be reduced. To this end the electric interpolation circuit is characterized in that the second output of the third pair of outputs is connected to a first input of the first pair of inputs. This means that the third pair of output signals is non-complementary.

The invention is based on the recognition of the fact that a smaller number of impedance elements is needed to generate the same number of output-signal pairs. This can be achieved because it is no longer necessary to take these output signals from nodes situated at like positions along the two strings. In some cases it is even found that one string may be wholly dispensed with.

The simplest known circuit is that in which only one pair of signals is derived from the first and the second pair of input signals. This means that such a circuit has three pairs of outputs. To replace such a known circuit the circuit in accordance with the invention is characterized in that the first output of the third pair of outputs is connected to a first input of the second pair of inputs. The known circuit is an interpolation circuit having three pairs of outputs, a third pair of complementary output signals being available at the third pair of outputs. This third pair of output signals is obtained from the first and the second pair of input signals after interpolation. For this purpose the known circuit requires four impedance elements. The circuit in accordance with the invention, which can replace the known circuit, in fact needs no impedance elements at all. Moreover, this circuit cannot be referred to as an interpolation circuit because the third pair of output signals is now derived directly from the two pairs of input signals, instead of via interpolation. Further, the pair of output signals appearing at the third pair of outputs is not complementary. Nevertheless, these signals provide the same information necessary for deriving a digital signal in the A/D converter as would have been obtained by means of the known circuit. This information can be obtained from the sample latch connected to the third pair of outputs.

Hereinafter, it will also appear that in many cases pairs of outputs in circuits in accordance with the invention supply pairs of signals which are non-complementary to one another.

The electric circuit comprising a string of at least two series connected impedance elements between the second input of the first pair of inputs and the first input of the second pair of inputs is characterized in that the first output of the third pair of outputs is connected to one end of the impedance element which has its other end connected to the second input of the first pair of inputs. If the string in this circuit comprises exactly two impedance elements and five pairs of outputs are provided five pairs of output signals can be generated, by an appropriate coupling of these five pairs of outputs to nodes in the circuit, in such a way that the sample latches connected to said five pairs of outputs are capable of supplying the same information for A/D conversion as if they were connected to the five pairs of outputs of the known interpolation circuit. This can be achieved in that a first output of the fourth pair of outputs is connected to one end of the impedance element which has its other end connected to the first input of the second pair of inputs and in that a first output of the fifth pair of outputs is connected to the first input of the first pair of inputs and the second output of the fifth pair of outputs is connected to the first input of the second pair of inputs.

BRIEF DESCRIPTION OF THE DRAWINGS

Some embodiments of the invention will now be described in more detail, by way of example, with reference to the accompanying drawings. In the drawings:

FIG. 5 shows another known interpolation circuit, FIG. 6 shows an embodiment which can replace the known interpolation circuit of FIG. 5.

DESCRIPTION OF THE PREFERRED EMBODIMENTS

Figure 1:
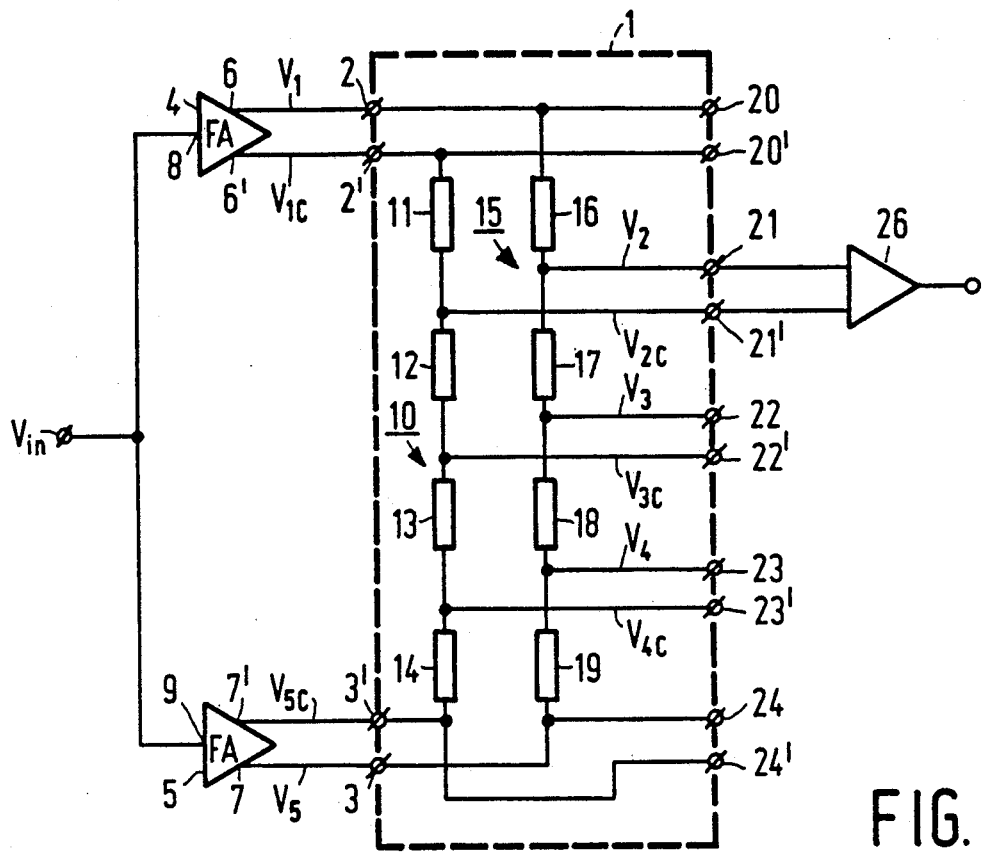
FIG. 1 shows an electric circuit comprising a known interpolation circuit.

Elements in different Figures bearing the same reference numerals are identical.

FIG. 1 shows a known electric circuit comprising an interpolation circuit 1. The interpolation comprises two pairs of inputs 2, 2' and 3, 3'. Two signals $V_1$ and $V_{1c}$ which are substantially complementary to one another can be applied to the first pair of inputs 2, 2'. Similarly, two signals $V_5$ and $V_{5c}$ which are substantially complementary to each other can be applied to the second pair of inputs 3, 3'. For this purpose two signal sources 4 and 5, each having two outputs 6, 6' and 7, 7' respectively, for supplying two pairs of substantially complementary signals, are connected to said inputs 2, 2' and 3, 3' respectively. An input signal $V_{in}$ is applied to the inputs 8 and 9.

The signal sources 4 and 5 may be arbitraty signal sources, provided that they can each generate two mutually complementary output signals. Examples of such signal sources are: a signal source having a differential output or a folding amplifier as described in, for example, the afore mentioned European Patent Application 227,165.

Herein "substantially complementary" is to be understood to mean that at least the variable components of two signals are substantially complementary to one another. As will be described hereinafter with reference to FIG. 4, for example, the signals $V_1$ and $V_{1c}$ are complementary to each other. This means that their waveforms vary in a complementary manner about a DC component $V_0$ which is not necessarily zero.

The known interpolation circuit 1 comprises two strings of impedance elements. One string 10 is arranged between the inputs 2' and 3' and comprises four series connected identical impedance elements, preferably resistors, 11 to 14. The second string 15 is arranged between the inputs 2 and 3 and comprises four series connected impedance elements of the same impedance value, preferably resistors, 16 to 19. The interpolation circuit comprises five pairs of outputs 20, 20'; 21, 21'; 22, 22'; 23, 23' and 24, 24'. The pair 20, 20' is connected to the pair of inputs 2, 2'. The pair 24, 24' is connected to the pair of inputs 3, 3'. The pair of outputs 21, 21' is connected to the nodes between the impedances 16, 17 and 11, 12 respectively. The pair of outputs 22, 22' is connected to the nodes between the impedances 17, 18 and 12, 13 respectively. The pair of outputs 23, 23' is connected to the nodes between the impedances 18, 19 and 13, 14, respectively.

Figure 4:
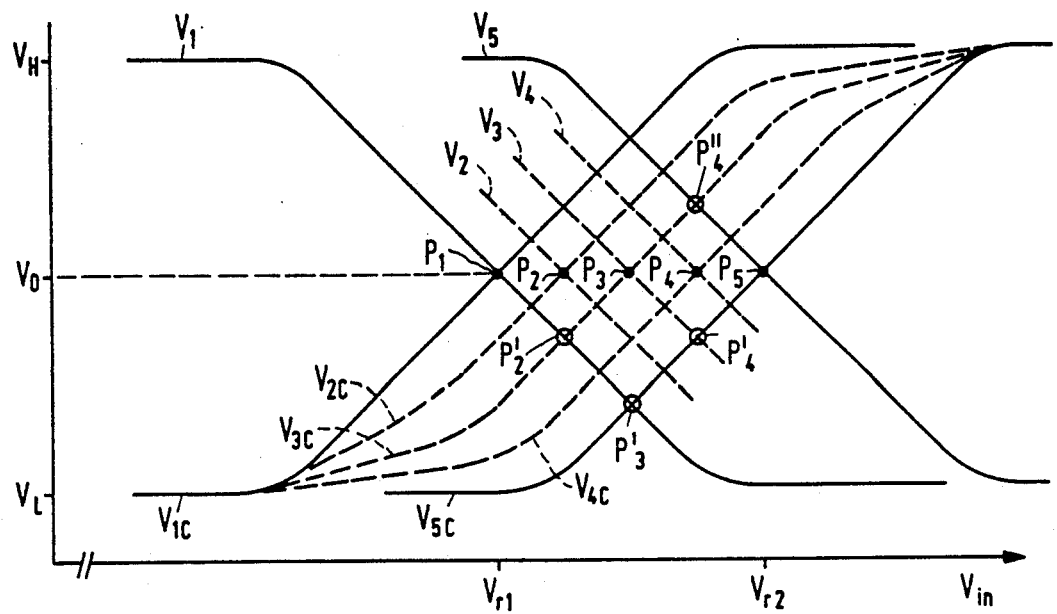
FIG. 4 shows a number of signal waveforms appearing at various points in the circuits of FIGS. 1, 2 and 3.

FIG. 4 shows the output signals $V_1$, $V_{1c}$, $V_5$, $V_{5c}$ of the two signal sources 4 and 5 as a function of the input signal $V_{in}$. If the signal source 4 is a folding amplifier it has a number of reference signals with which the input signal $V_{in}$ is compared. If the input signal $V_{in}$ changes from a value slightly smaller than $V_{r1}$ to a value slightly larger than $V_{r1}$ the signal $V_1$ and hence its complementary signal $V_{1c}$, is subject to a change. Around the value of the reference signal $V_{r1}$ the output signal $V_1$ changes from a value $V_H$ to a value $V_L$, and at the same time the output signal $V_{1c}$ changes from a value $V_L$ to the value $V_H$. For other reference values in the folding amplifier larger than $V_{r1}$ a similar change occurs. For the next reference value above $V_{r1}$ the value of $V_1$ changes from $V_L$ to $V_H$, while $V_{1c}$ changes from $V_H$ to $V_L$ etc.

Similarly, the folding amplifier 5 has a number of reference signals, of which one signal, $V_{r2}$ is shown in FIG. 4. This means that around the value of $V_{r2}$ the signal $V_5$ changes from $V_H$ to $V_L$, while the signal $V_{5c}$ changes from $V_L$ to $V_H$. The behavior of the folding amplifier 5 is identical to the behavior of the folding amplifier 4, except that the transitions are shifted by a value $V_{r2}-V_{r1}$ along the $V_{in}$ axis.

The interpolated signals $V_2$ and $V_{2c}$ appear on the outputs 21 and 21'. The interpolated signals $V_3$ and $V_{3c}$ appear on the outputs 22 and 22' and the interpolated signals $V_4$ and $V_{4c}$ are available at the outputs 23 and 23'. In FIG. 4 these signals are shown in broken lines as a function of the input signal $V_{in}$.

For converting the analog input signal $V_{in}$ into a digital signal the pairs of complementary signals $V_1$, $V_{1c}$; $V_2$, $V_{2c}$; $V_3$, $V_{3c}$; $V_4$, $V_{4c}$ and $V_5$, $V_{5c}$ appearing on the pairs of outputs 20, 20'; 21, 21'; 22, 22'; 23, 23' and 24, 24' in FIG. 1 are applied to the sample latches. Only one sample latch 26 is shown. The sample latch 26, as well as the sample latches connected to the other pairs of outputs, respond(s) to the crossing of signals applied to the two inputs of the sample latch(es). In fact, the outputs of these sample latches detect the intersections $P_1$ to $P_5$ of the complementary signals in FIG. 4. For that value of $V_{in}$ for which the intersections $P_1$ to $P_5$ occur, the outputs of the sample latches "change over", i.e. the output of a sample comparator goes from "high" to "low" or vice versa.

A further coding of the signals appearing at the outputs of the sample latches may yield a digital signal which is a digital replica of the analog input signal $V_{in}$.

Figure 2:
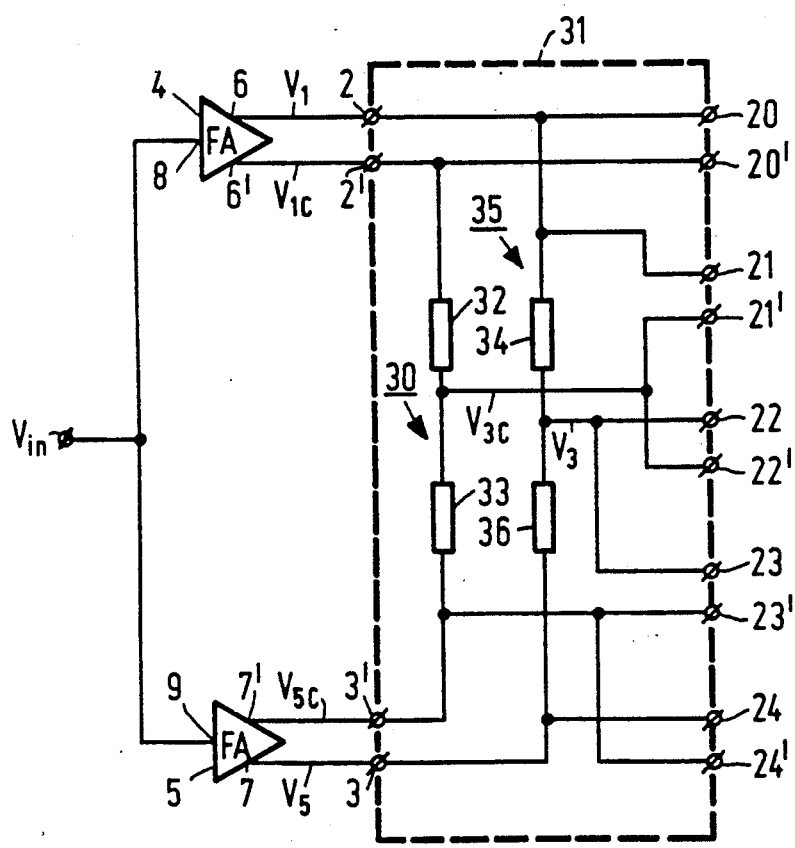
FIG. 2 shows a first embodiment of the invention

FIG. 2 shows an embodiment of the circuit 31 in accordance with the invention which can replace the known circuit of FIG. 1. The circuit 31 again comprises two strings 30 and 35 of impedance elements. The string 30 comprises a series arrangement of two identical impedance elements 32 and 33. The string 35 comprises a series arrangement of two identical impedance elements 34 and 36. Preferably, all of the impedance elements are resistors. The circuit 31 now generates only the signals $V_3$ and $V_{3c}$ and not the signals $V_2$, $V_{2c}$, $V_4$ and $V_{4c}$ of FIG. 4. The signals $V_3$ and $V_{3c}$ are complementary to one another and appear on the nodes between the impedance elements 34, 36 and 32, 33, respectively. These nodes constitute the outputs 22 and 22'. The pairs of outputs 20, 20' and 24, 24' are thus obtained in the same way as in the known circuit 1 in FIG. 1 and are consequently connected to the pairs of inputs 2, 2' and 3, 3' respectively.

The pairs of outputs 21, 21' and 23, 23' are obtained in another way. The output 21 is connected to the input 2. The output 21' is connected to the node between the impedances 32 and 33. The output 23 is connected to the node between the impedances 34 and 36, and the output 23' is connected to the input 3'.

Sample latches (not shown) connected to the pairs of outputs 20, 20'; 22, 22' and 24, 24' again detect the value for $V_{in}$ for which the signals $V_1$ and $V_{1c}$; $V_3$ and $V_{3c}$, and $V_5$ and $V_{5c}$ intersect one another. Thus, the intersections $P_1$, $P_3$ and $P_5$ are defined, see FIG. 4. Since the interpolation circuit 31 does not derive the signals $V_2$, $V_{2c}$, $V_4$ and $V_{4c}$ the intersections $P_2$ and $P_4$ cannot be determined.

Instead of these intersections the sample latches (not shown) connected to the pairs of outputs 21, 21' and 23, 23' determine the intersections $P_2$, and $P_4$, (the intersection of the signals $V_1$ and $V_{3c}$ and the signals $V_3$ and $V_{5c}$). In FIG. 4 these intersections are represented as open circles. These intersections coincide with the same value of the input signal $V_{in}$ as the intersections $P_2$ and $P_4$ and may therefore also be used in the subsequent encoding step. From the foregoing it is obvious that each of the pairs of outputs 21, 21' and 23, 23' in FIG. 2 supplies a pair of output signals which are not complementary to one another. Nevertheless, A/D conversion is performed correctly.

The circuit of FIG. 2 has several advantages over the interpolation circuit shown in FIG. 1. The number of tappings of the interpolation resistors in the circuit of FIG. 2 is smaller so that the overall stray capacitance in the circuit, if realized in integrated form, is substantially lower. Moreover, the output impedances of the outputs 21, 21'; 22, 22' and 23, 23' are substantially lower. This applies in the case of the practial assumption that the impedance values of the elements 32, 33, 34 and 36 are equal to each other and are equal to the impedance value of each of the impedances 11 to 14 and 16 to 19.

It is evident from FIG. 4 that instead of the intersection $P_4$, between the signals $V_3$ and $V_{5c}$ the intersection $P_{4''}$ between the signals $V_{3c}$ and $V_5$ could have been determined. This would have meant that the output 23 had to be connected to the input 3 and the output 23' to the node point between the impedances 32 and 33.

Figure 3A:
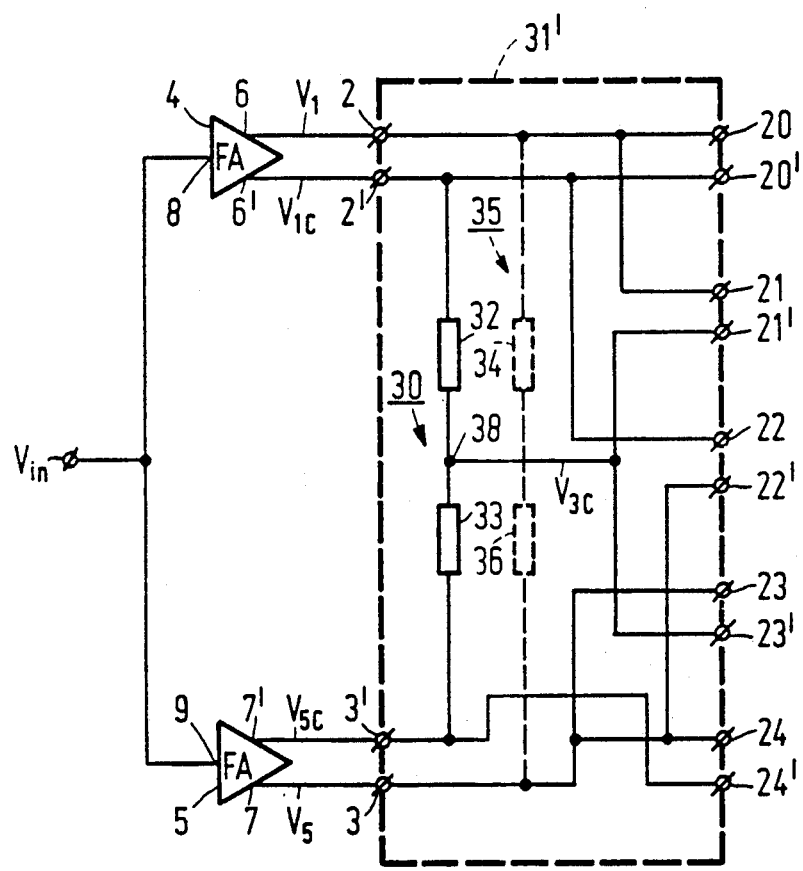
FIG. 3a shows a modified form of the embodiment of FIG. 3.
Figure 3:
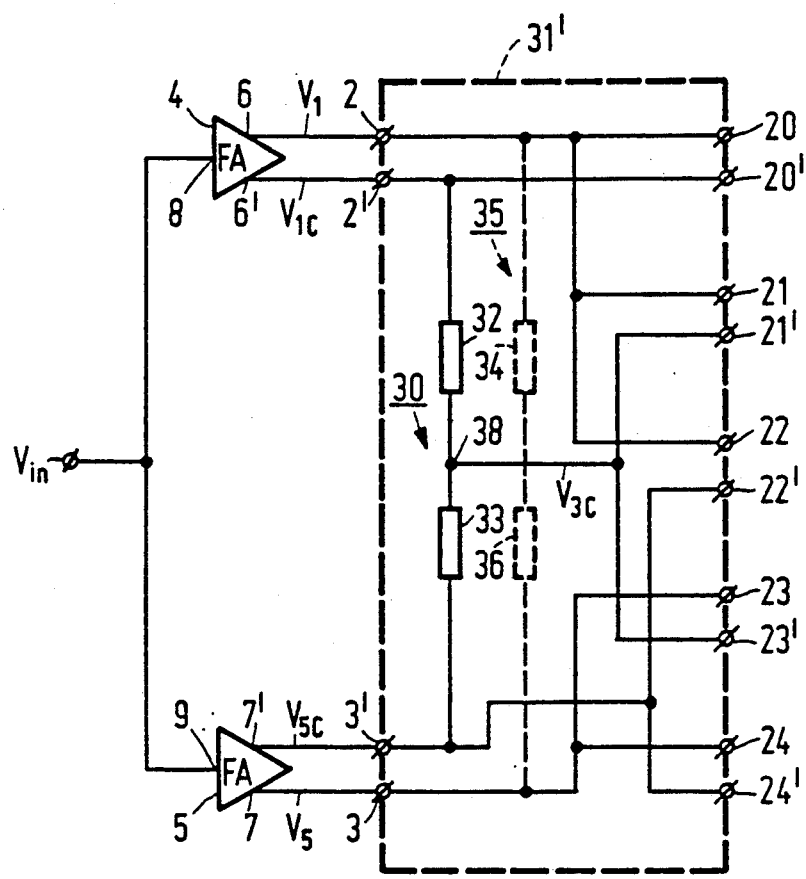
FIG. 3 shows a second embodiment of the electric circuit in accordance with the invention which can replace the known circuit of FIG. 1.

FIG. 3 shows an embodiment 31' of the circuit which bears a close resemblance to the circuit of FIG. 2 and which can also replace the known interpolation circuit of FIG. 1. As in the alternative given above, the outputs 23 and 23' are connected respectively to the input 3 and to the node between the impedances 32 and 33, respectively. Moreover, the outputs 22 and 22' are connected to the inputs 2 and 3' respectively.

The following intersections in FIG. 4 are now determined: $P_1$, $P_{2'}$, $P_{3'}$ $P_{4''}$ and $P_5$. The circuit of FIG. 3 has a minimal number of tappings on the impedance elements and moreover the output impedance of the outputs 22, 22' is substantially lower than that of the corresponding outputs in the circuit shown in FIG. 2. Moreover, it is to be noted that no tapping is needed from the node between the impedance elements 34 and 36. Thus, in this case the two impedance elements 34 and 36 may be dispensed with. Therefore the string 35 of impedance elements is shown in broken lines. Thus the circuit 31' requires only a minimal number of components in order to obtain the three intermediate intersections $P_2'$, $P_3'$ and $P_4''$.

FIG. 3a shows a modification of the circuit of FIG. 3. In FIG. 3a, output terminal 22 is now connected to input terminal 2' and output terminal 22' is connected to input terminal 3.

FIG. 5 shows a known interpolation circuit 40 comprising two pairs of inputs 2, 2' and 3, 3', to which pairs of complementary signals $V_1$, $V_{1c}$ and $V_9$, $V_{9c}$, respectively can be applied. The known circuit comprises nine pairs of outputs 20, 20'; 24, 24' and 43, 43' to 49, 49'.

The two strings 41 and 42, each comprising 8 series-connected impedance elements having the same impedance values, are arranged between the inputs 2', 3' and 2, 3 respectively.

Figure 7:
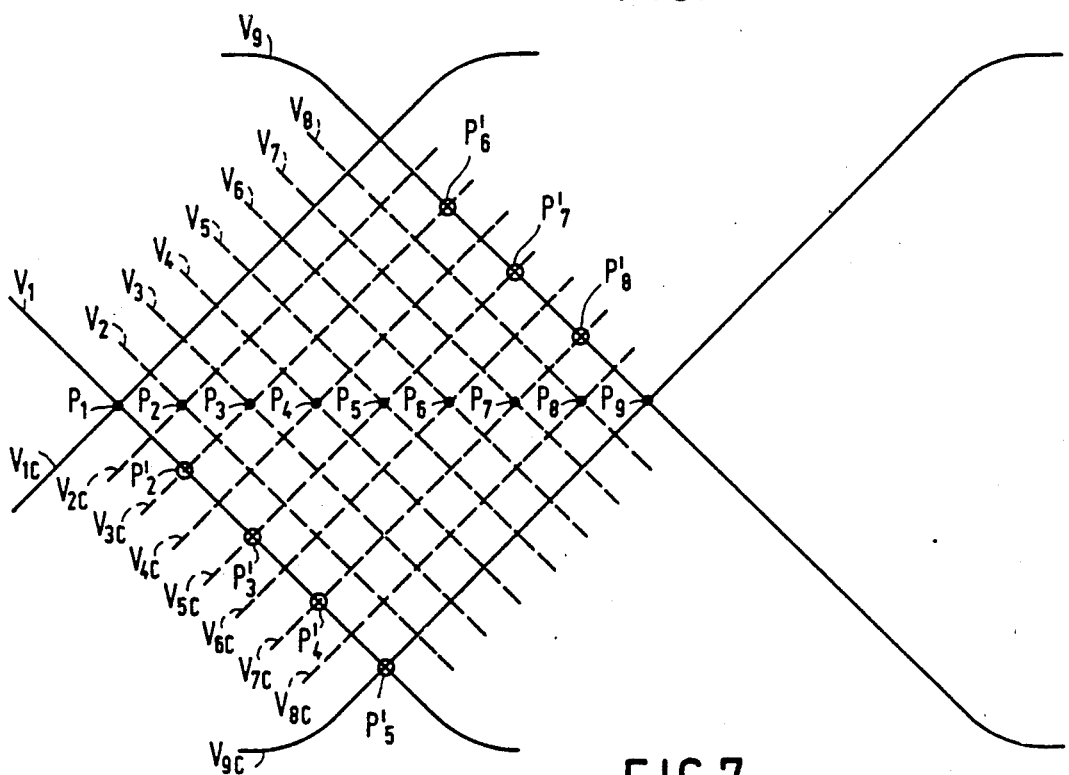
FIG. 7 shows a number of signal waveforms appearing at various points in the circuits of FIGS. 5 and 6.

FIG. 7 shows the input signals $V_1$ and $V_9$ which are applied to the inputs 2 and 3 and which can be taken from the outputs 20 and 24, and the complementary signals $V_{1c}$ and $V_{9c}$ which are applied to the inputs 2' and 3' and which appear on the outputs 20' and 24'. The signal pairs $V_2$, $V_{2c}$ to $V_8$, $V_{8c}$ are signals which are generated by means of the known interpolation circuit and which appear on the outputs 43, 43' to 49, 49'.

By means of sample latches (not shown) connected to the outputs of the interpolation circuit 40 it is possible to determine the intersections $P_1$ to $P_9$ in FIG. 7 between the various pairs of complementary signals.

FIG. 6 shows a circuit 40' in accordance with the invention which can replace the known interpolation circuit 40 of FIG. 5. By means of sample latches (not shown) connected to the pairs of outputs 20, 20' and 24, 24' it is again possible to detect the intersections $P_1$ and $P_9$ of FIG. 7. The sample latches (not shown) connected to the pairs of outputs 43, 43' to 49, 49' now detect the intersections $P_2'$ to $P_8'$ indicated as open circles in FIG. 7.

The intersections $P_2'$ to $P_5'$ take the place of the intersections $P_2$ to $P_5$ and represent the intersections of the signal $V_1$ with the respective signals $V_{3c}$, $V_{5c}$, $V_{7c}$ and $V_{9c}$. This means that the outputs 43, 44, 45 and 46 should be connected to the input 2, that the outputs 43', 44' and 45' should be connected to the respective nodes 50, 51 and 52 and that the output 46' should be connected to the input 3'. For this purpose a string 53 of four series connected identical impedance elements 54 to 57 is arranged between the inputs 2' and 3'.

The intersections $P_6'$, $P_7'$ and $P_8'$ take the place of the intersections $P_6$, $P_7$ and $P_8$ and represent the intersections of the signal $V_9$ with the respective signals $V_{3c}$, $V_{5c}$ and $V_{7c}$. This means that the outputs 47, 48 and 49 should be connected to the input 3 and that the outputs 47', 48' and 49' are connected to the respective nodes 50, 51 and 52. Again the pairs of outputs 20, 20' and 24, 24' are connected to the pairs of inputs 2, 2' and 3, 3' respectively.

Again it is obvious that no (second) string 58 of four impedance elements is needed between the inputs 2 and 3. Therefore, this string 58 is indicated in broken lines.

Figure 8:
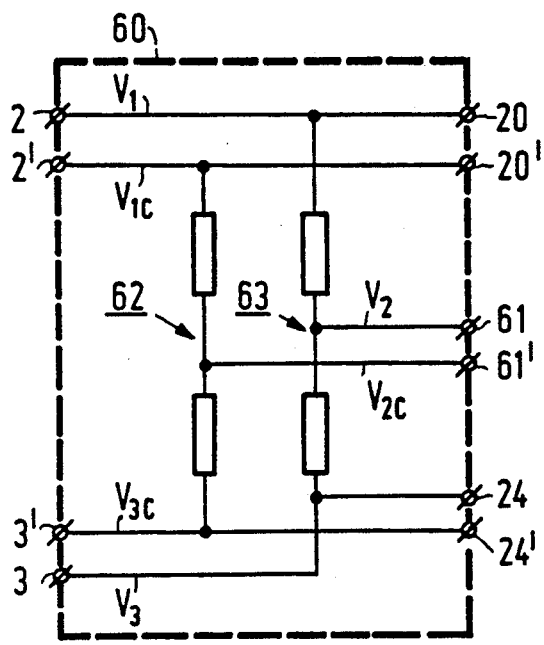
FIG. 8 shows yet another known interpolation circuit.
Figure 10:
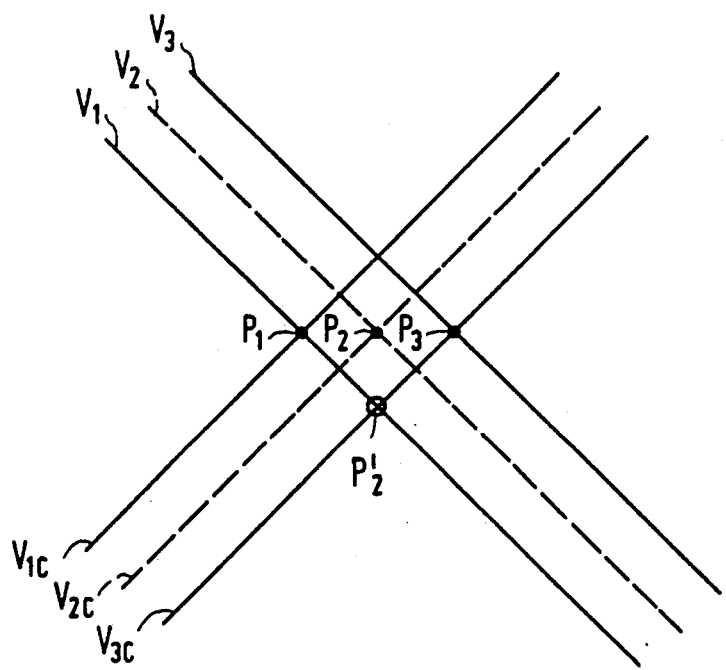
FIG. 10 shows a number of signals appearing at various points in the circuits of FIGS. 8 and 9.

FIG. 8 shows the simplest known interpolation circuit 60 comprising two strings 62 and 63 of two series connected identical impedance elements each. A pair of complementary signals $V_2$, $V_{2c}$ is supplied to the pair of outputs 61, 61'. The various signals in the known interpolation circuit of FIG. 8 are indicated in FIG. 10. From this it is evident that only one pair of complementary signals is derived by interpolation from the two pairs of input signals $V_1$, $V_{1c}$ and $V_3$, $V_{3c}$. The intersections $P_1$, $P_2$ and $P_3$ in FIG. 10 can be determined by means of three sample latches (not shown) connected to the three pairs of outputs.

Figure 9:
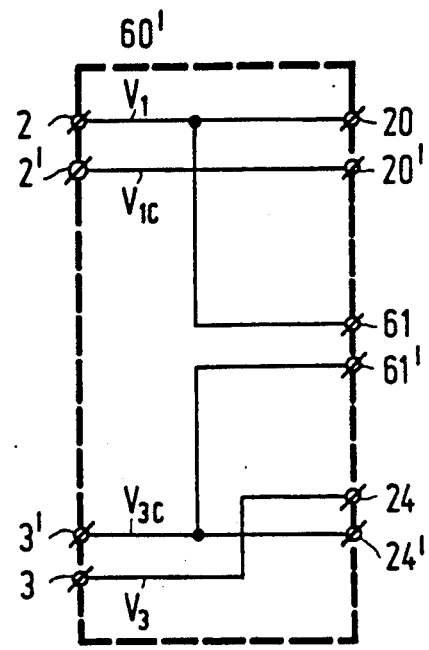
FIG. 9 shows an embodiment which can replace the known circuit of FIG. 8.

FIG. 9 shows a circuit in accordance with the invention which can replace the known interpolation circuit of FIG. 8. The output 61 is now connected to the input 2 and the output 61' is connected to the input 3'. The sample latch (not shown) connected to the pair of outputs 61, 61' thus detects the intersection $P_2'$ between the signals $V_1$ and $V_{3c}$. The circuit of FIG. 9 with the following sample latches thus enables the intersection $P_1$, $P_2'$ and $P_3$ to be determined.

Figure 11:
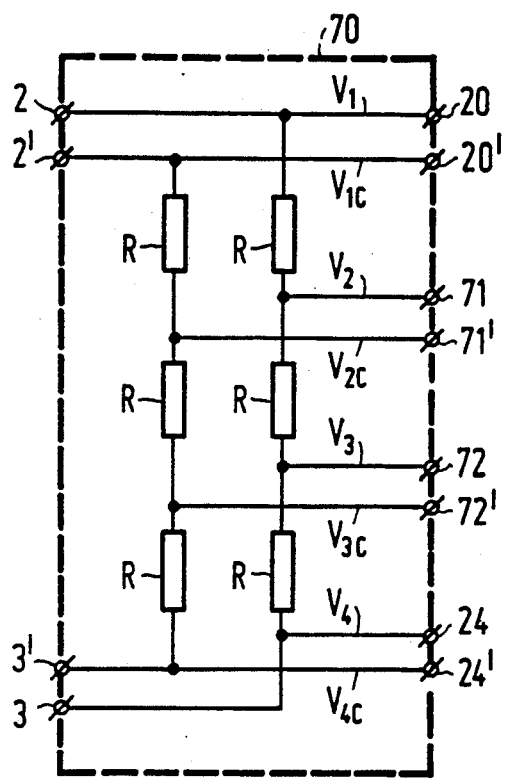
FIG. 11 shows still another known interpolation circuit.
Figure 12:
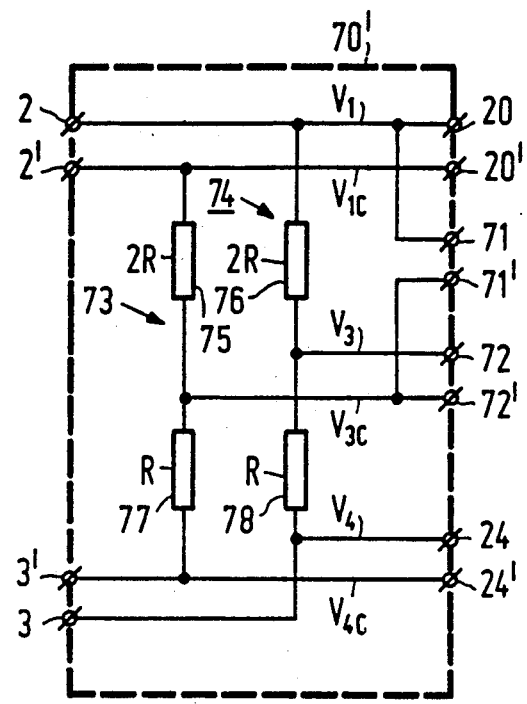
FIG. 12 shows an embodiment which can replace the known circuit of FIG. 11.

So far only circuits comprising an odd number of output pairs have been described. However, the invention can also be applied to circuits having an even number of output pairs. FIGS. 11 and 12 show examples of such circuits.

Figure 13:
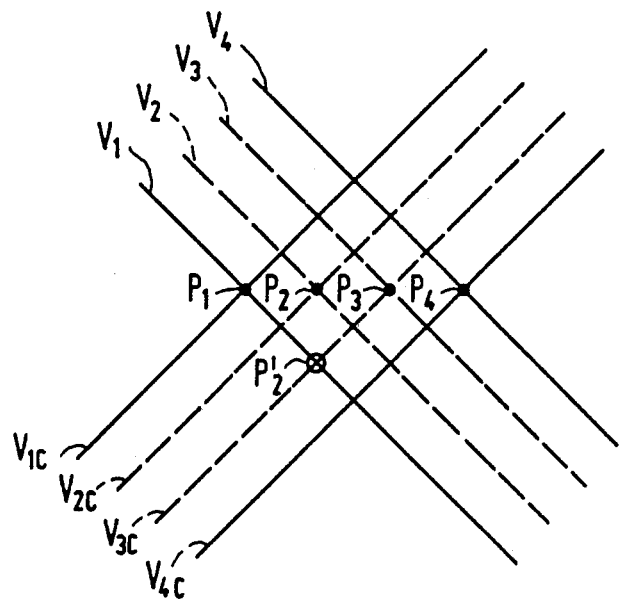
FIG. 13 shows a number of signals appearing at various points in the circuits of FIGS. 11 and 12.

FIG. 11 shows a known interpolation circuit having four pairs of outputs 20, 20'; 71, 71'; 72, 72'; 24, 24'. The known circuit, which comprises two strings of three series connected impedance elements each (resistors having equal resistance values R), supplies two pairs of output signals $V_2$, $V_{2c}$ and $V_3$, $V_{3c}$, which are derived from the two pairs of input signals $V_1$, $V_{1c}$ and $V_4$, $V_{4c}$ by interpolation. FIG. 13 shows the four pairs of signals appearing in the known circuit. Sample latches (not shown) connected to the pairs of outputs 20, 20'; 71, 71'; 72, 72' and 24, 24' detect the intersections $P_1$ to $P_4$ between the respective pairs of output signals $V_1$, $V_{1c}$; $V_2$, $V_{2c}$; $V_3$, $V_{3c}$ and $V_4$, $V_{4c}$.

FIG. 12 shows the circuit 70' in accordance with the invention which can replace the circuit 70. The circuit 70' again comprises two strings of impedance elements. Both strings 73 and 74 each comprise a series arrangement of two impedance elements R, 2R. The impedance value (2R) of one impedance element 75, 76 in each string 73 or 74 is equal to twice the impedance value (R) of the other element 77 or 78 in the respective string 73 or 74. The two impedance elements 75 and 76 may obviously comprise a series arrangement of two impedance elements of the value R. Such a construction is preferred if the circuit 70' is integrated. Sample latches (not shown) connected to the pairs of outputs of the circuit 70' now detect the intersections $P_1$, $P_2'$, $P_3$ and $P_4$. This circuit 70' has the advantage that although its overall impedance value is equal to that of the circuit 70 in FIG. 11, the number of tappings on the impedance string can be reduced.

It is to be noted that various modifications of the embodiments are possible without departing from the scope of the invention as defined in the appended Claims. For example, if desired, in FIGS. 4, 7, 10 and 13 intersections can be determined other than the intersections detected by means of the embodiments described.

What is claimed is:

1. An interpolation circuit comprising: a first and a second pair of inputs with each pair of inputs receiving two complementary input signals having edges with finite slopes, at least three pairs of outputs with each of at least two pairs of said outputs supplying two output signals which are substantially complementary to one another, the first pair of outputs being connected to the first pair of inputs and the second pair of outputs being connected to the second pair of inputs, means connecting a first output of the third pair of outputs to a circuit node other than one of the inputs of the first pair of inputs, and means connecting a second output of the third pair of outputs to a first input of the first pair of inputs.

2. An interpolation circuit as claimed in claim 1 wherein said third pair of outputs supply a non-complementary pair of interpolation output signals determined by the input signal at the first input of the first pair of inputs and by a signal at said circuit node.

3. An interpolation circuit as claimed in claim 2 wherein said circuit node comprises a first input of the second pair of inputs.

4. An interpolation circuit as claimed in claim 1 wherein said circuit node comprises a first input of the second pair of inputs.

5. An interpolation circuit as claimed in claim 1 further comprising at least first and second series connected impedance elements coupled between one input of said first pair of inputs and one input of said second pair of inputs, and wherein said circuit node comprises a junction point between said first and second series connected impedance elements.

6. An interpolation circuit as claimed in claim 2 further comprising at least first and second series connected impedance elements coupled between one input of said first pair of inputs and one input of said second pair of inputs, wherein said circuit node comprises a junction point between said first and second series connected impedance elements, a fourth pair of outputs for supplying a pair of non-complementary output signals, means connecting a first output of the fourth pair of outputs to said circuit node, and means connecting a second output of the fourth pair of outputs to one input of said second pair of inputs.

7. An interpolation circuit as claimed in claim 2 further comprising at least first and second series connected impedance elements coupled between one input of said first pair of inputs and one input of said second pair of inputs, wherein said circuit node comprises a junction point between said first and second series connected impedance elements, at least third and fourth series connected impedance elements coupled between the other input of said first pair of inputs and the other input of said second pair of inputs, a fourth pair of outputs for supplying a pair of non-complementary output signals, means connecting a first output of the fourth pair of outputs to a circuit node between said third and fourth series connected impedance elements, and means connecting a second output of the fourth pair of outputs to one input of the second pair of inputs or to said circuit node between the first and second series connected impedance elements.

8. An interpolation circuit as claimed in claim 7 wherein said first, second, third and fourth impedance elements comprise first, second, third and fourth resistors, respectively, and with the resistance values of the first and second resistors in the ratio of 2R to R and the resistance values of the third and fourth resistors in the ratio of 2R to R.

* * * * *